April 30, 1974 G. K. HERB ET AL 3,808,108

SEMICONDUCTOR DEVICE FABRICATION USING NICKEL TO MASK CATHODIC ETCHING

Filed Dec. 20, 1971 2 Sheets-Sheet 1

United States Patent Office 3,808,108
Patented Apr. 30, 1974

3,808,108
SEMICONDUCTOR DEVICE FABRICATION USING NICKEL TO MASK CATHODIC ETCHING

George Kenneth Herb, Reading, and Edward Franklin Labuda, Allentown, Pa., assignors to Bell Telephone Laboratories, Incorporated, Murray Hill, N.J.

Filed Dec. 20, 1971, Ser. No. 209,560
Int. Cl. C23b *5/50;* C23f *17/00*
U.S. Cl. 204—32 S 4 Claims

ABSTRACT OF THE DISCLOSURE

In the fabrication of semiconductor devices, particularly integrated circuit devices, using the multiple metal system of beam lead technology, the proper delineation of the metal interconnection pattern using wet chemistry is limited by the inherent isotropy of the etching process. In accordance with this invention the metallization pattern is defined using cathodic etching, or backsputtering, to remove unwanted layers of metal as defined by an electrodeposited mask of nickel. Well-defined nickel patterns can be precisely formed by electrodeposition using photoresist techniques for masking. The process eliminates the undercutting and lack of definition contributed by chemical etching processes.

This invention relates to the fabrication of a semiconductor device and, more particularly, to a method for delineating the metallization pattern on the active face of a semiconductor device.

BACKGROUND OF THE INVENTION

In the fabrication of both discrete and integrated semiconductor devices, precise, closely spaced metallization patterns provide electrodes and interconnections between electrodes so as to produce operable devices. Satisfactory electronic characteristics and compatible mechanical characteristics have led to the use of multiple layers of different metals to achieve the desired sealing and adherence qualities. The formation of precise patterns of these multiple metal layers has presented problems, particularly when the degree of definition requires tolerances of less than 10 microns. The disclosures of M. P. Lepselter, Pat. 3,335,338, Aug. 8, 1967, and J. M. Szabo, Jr., Pat. 3,388,-048, June 11, 1968, exemplify one method using cathodic etching and another using liquid etchants to produce metallization patterns.

Although liquid etchants can be formulated to attack the various metals and materials used on a more or less selective basis, etching presents the inherent problem that material removal occurs isotropically, that is, in all directions at the same rate. Thus, if relatively thick layers of metal are employed, considerable undercutting occurs, rendering precise definition very difficult and close spacing well nigh impossible.

The undercutting is effectively amplified when, in subsequent steps, deposited metal extends over vertical steps in the insulating layers on top of the silicon. Certain metals, in particular electroplated gold, tend to plate under the photoresist mask. These effects all degrade definition and tend to result in short circuits.

While cathodic etching or backsputtering using various materials to mask the process has been previously taught in connection with semiconductor device fabrication, there remains the problem of defining the mask for the cathodic etching process itself. Where such definition is limited to a process using liquid etching the problem of achieving precise definition described above remains. This is true of materials previously suggested for masking cathodic etching such as aluminum, molybdenum and chromium. These metals are not readily electrodeposited. Accordingly, an improved method for forming and utilizing a cathodic etching mask is desired.

SUMMARY OF THE INVENTION

In accordance with this invention the metallization pattern on a semiconductor device is formed by cathodic etching using a layer of nickel electrodeposited in accordance with the desired metallization pattern. Advantageously, this mask of nickel is produced by electrodeposition using a dielectric material such as a photosensitive resist as the mask for the electrodeposition. Thus, the process inherently has the same degree of definition as the photoresist development technique and the use of a liquid etchant to define the sputter etch mask is avoided.

The process may be practiced advantageously with techniques which render the process self-limiting. The process erases the effect of nonuniform depositions of the multiple metal layers which occur particularly at the periphery of the surface being deposited upon. Moreover, the use of nickel is particularly advantageous in combination with the materials associated with the beam lead technology; namely, titanium, platinum or palladium, and gold.

In a particular embodiment a semiconductor body in which the significant impurity processing, diffusion and the like, has been completed, is suitably masked for the formation of electrode connections and a first layer of titanium is deposited on the entire active face of the body. The titanium layer then is covered by a layer of either platinum or palladium, which in turn is covered with a relatively thick layer of gold. A mask of photoresist material conforming to the desired metallization pattern then is formed on top of the gold layer and a layer of nickel is electrodeposited on the unmasked areas of the gold layer. Advantageously, prior to the formation of the photoresist mask a very thin film of nickel may be applied over the entire layer to improve the adherence of the photoresist layer to the underlying gold surface.

Because of the excellent masking properties of nickel, relatively thin layers may be used which are thinner than the masking film of photoresist. Thus, the obtainable pattern resolution is limited only by the capabilities of the photoresist process.

The photoresist material then is removed leaving the thick nickel layer as a mask on top of the gold layer. The active face of the semiconductor body then is subjected to cathodic etching using a typical sputter etching system. During this step the nickel layer is little etched while the gold, palladium or platinum, and titanium are etched away at a more rapid rate. Thus, the exposed areas of these metals are removed while the portions underlying the nickel mask remain.

It will be appreciated that the above-described process enables formation of the multilayer metallization pattern as a continuous and uniform metal structure. In particular, as compared to prior art methods, the several layers of different metals are not subjected to separate photoresist masking or wet chemical treatment. In addition, the thick gold layer is produced without the interruption of an intermediate photomasking which is customary in the prior art. These advantages enhance the uniformity, performance and reliability of the semiconductor device.

The presence of oxygen in the sputtering chamber provides a convenient control with respect to certain materials. For example, with respect to certain of the metals referred to in describing this invention, the presence of oxygen slows the cathodic etching of titanium and nickel, but has little effect on the removal rate of gold, palladium and platinum.

Accordingly, oxygen may be admitted during the process as the palladium or platinum layer is removed. The presence of oxygen enables the formation of a titanium oxide film when the titanium layer is exposed. This film is more resistant to cathodic etching than pure titanium and effectively terminates the process. Where this technique is used the remaining relatively thin titanium layer is removed using a liquid etchant such as EDTA (ethylene diamine tetracetic acid).

BRIEF DESCRIPTION OF THE DRAWINGS

The invention and its various objects and features will be more clearly understood from the following detailed description taken in conjunction with the drawing in which.

DETAILED DESCRIPTION

Figure 1A:
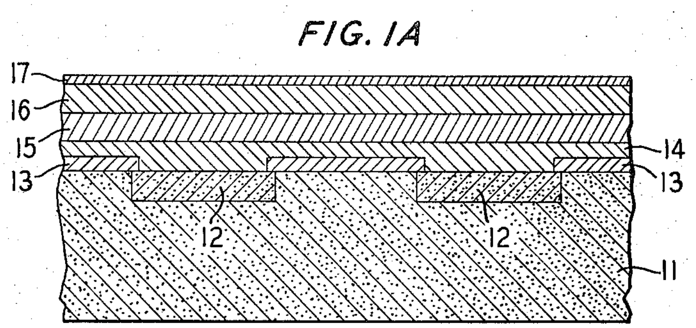
FIGS. 1A through 1E are cross sections of a portion of a semiconductor body illustrating successive steps in forming the metallization pattern for a semiconductor device in accordance with this invention.

One useful embodiment of the invention will be desribed in conjunction with FIGS. 1A through 1E. Referring to FIG. 1A, a silicon semiconductor body 11 containing p-n junctions 12 and having an overlying masking layer 13 of silicon oxide thereon is subjected to a succession of metal layer depositions.

First, a layer 14 of titanium is deposited to a thickness of from 500 to 1000 A. followed in turn by the deposition of a second layer 15 of platinum or palladium to a thickness of about 2000 A. In the case of bipolar semiconductor devices platinum is preferred for this layer whereas, at the present time, for insulated gate field effect devices this second layer is of palladium. On top of the second metal layer 15 there is deposited a third layer 16 of gold to a thickness of about 2 microns (20,000 A.). These three layers may be deposited satisfactorily by a variety of processes. For example, they may be formed by evaporation or cathodic sputtering, and, in the case of gold, by electrodeposition.

Figure 1B:
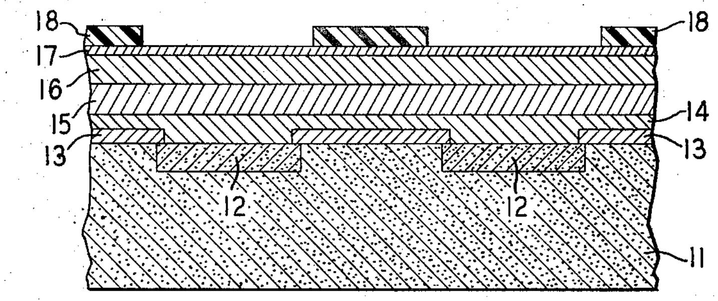

A next step is to electrodeposit on top of gold layer 16 a very thin layer 17 of nickel to enhance the adherence of the next to be applied photoresist layer 18. A suitable electroplating bath based on nickel sulfamate is the type SM bath procurable from the Allied-Kelite Products Division, Richardson Chemical Company, 81 Industrial Road, Berkeley Heights, N.J. Advantageously, the thin nickel layer 17 has a thickness of about 350 A. A film 18 of a photosensitive resist material then is formed on top of the thin nickel film 17, and the desired metallization pattern is developed therein by the standard exposure and development techniques. The structure then is as shown in FIG. 1B.

Figure 1C:
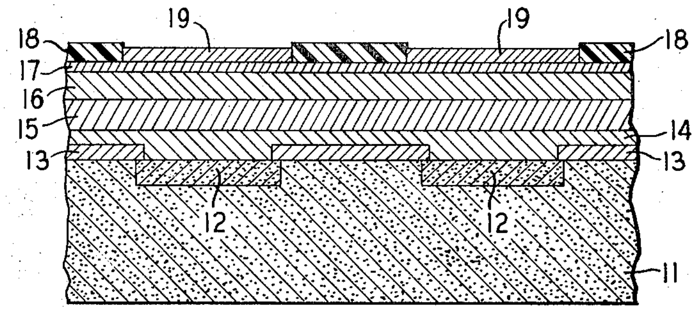

Next, as shown in FIG. 1C, a heavier film of nickel 19 is formed on the unmasked surface of metal film 17 using an electrodeposition technique. Both electroplating and electroless nickel plating may be used satisfactorily and, for the purposes of this disclosure, are encompassed by the term "electrodeposition." Typically, this final nickel layer has a thickness of 4000 to 5000 A. and, generally, is somewhat less than the thickness of the photoresist film so as not to degrade the definition of the pattern defined in the photoresist.

Alternatively, the metallization pattern may be defined in the nickel layer by electrodepositing nickel over the entire underlying metal surface, then forming a resist pattern over the portions to be retained and then removing the unmasked nickel to produce the nickel mask. One method of removing the unmasked nickel when the underlying metal is gold is by etching with ferric chloride.

Figure 1D:
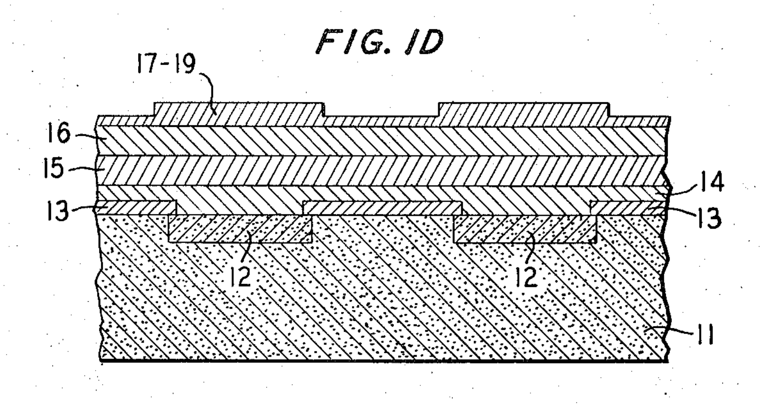

Next, as shown in FIG. 1D, the photoresist material is removed, conveniently by vaporization during exposure in a plasma generator. This process avoids the use of certain liquid solvents which may attack the nickel film. Alternatively, for positive photoresists acetone is a suitable solvent for the resist film.

The structure shown in FIG. 1D is placed in a sputtering apparatus for cathodic etching of the nickel coated surface 17–19. In a specific triode system a peak-to-peak RF voltage of 400 volts and a current density of one ampere per square inch is exemplary.

Using the above-specified parameters in a triode type sputtering apparatus the nickel layer, in the presence of oxygen, sputter etches at a rate of approximately 250 to 300 A. per minute. In the presence of oxygen, the gold layer sputters off at about 1600 A. per minute, and the platinum and palladium at about 500 to 600 A. per minute.

Alternatively, other known cathodic etching methods including direct current systems, may be used and the practice of the invention is not confined to the above-described triode system.

After removal of the thin nickel layer 17, gold layer 16 and platinum or palladium layer 15 the oxygen may be turned off and the sputter etching may be continued to remove the titanium layer 14. The sputter etching process then is terminated when the silicon oxide film 13 is reached. This procedure requires observation and, in effect, manual control of the process. The oxygen may be continued which will result in the formation of a titanium oxide film when titanium layer 14 is exposed. This has the effect of slowing the sputter etching process to a very low rate for titanium of about 10 to 15 A. per minute, thus effectively halting the removal process. This rate is in contrast to the removal rate for titanium without oxygen of about 50 to 60 A. per minute. In this alternative procedure the balance of the titanium film is readily removed using EDTA etchant.

Figure 1E:
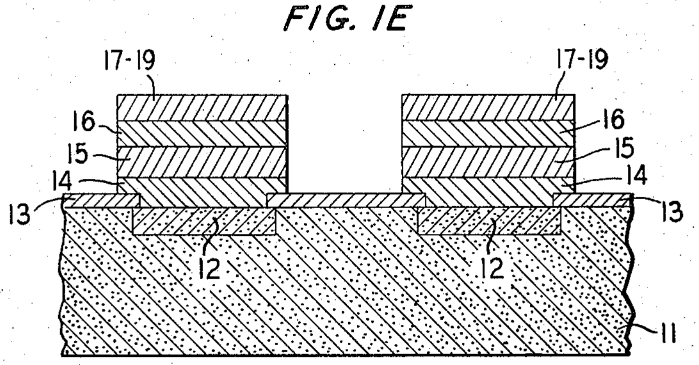

The semiconductor body 11 then will have the appearance generally as shown in FIG. 1E in which only the portions of the metallization pattern masked by the nickel layer 17–19 remains. Although in the cross section view shown the metallization portion comprises the electrodes making connection to the semiconductor body through the silicon oxide mask, it will be understood that the metallization pattern may comprise interconnection portions overlying the oxide or other dielectric films, such as combinations of silicon oxide, silicon nitride, and aluminum oxide.

In connection with this disclosure, it will be understood that reference to the formation of a layer or film of material on a semiconductor body is not limited to the arrangement in which the layer or film is in direct contact with a surface of the body, but is intended to encompass multiple layer arrangements in which the particular layer overlies other metal or dielectric layers or films. For example, in connection with the description of this invention the metal layer of particular significance and which is to be shaped to a particular pattern by masked cathodic etching is referred to as being formed on a surface of the semiconductor body. It will be understood that intervening this particular metal layer and the actual surface of the semiconductor body there may be one or more dielectric films such as silicon oxide, silicon nitride and aluminum oxide, as well as one or more metal films.

Finally, although not illustrated, the nickel layer may be removed conveniently by means of a solvent such as ferric chloride. Alternatively, in some arrangements the nickel may be left as a part of the metallization structure.

Referring to FIG. 1E, although the vertical dimensions are exaggerated and there are disproportions in the illustration, the sputter etched sides depicted for the metallization pattern are generally representative of the results obtained using the sputter etching procedure in accordance with this invention. It is this feature, as compared to the isotropic etching practice, which renders the invention particularly advantageous for precise definition of metallization patterns. It is apparent also that the sputter etching technique using electrodeposited nickel masks enables the fine tolerances and close spacing demanded by higher performance and higher quality semiconductor devices.

Figure 2A:
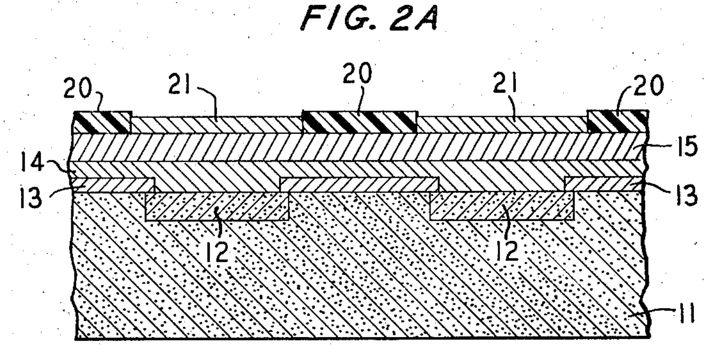
FIGS. 2A and 2B similarly illustrate an alternative embodiment in accordance with this invention.
Figure 2B:
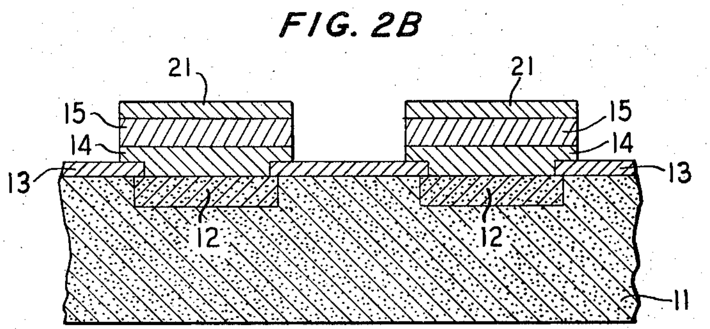

An alternative procedure employing the same electrodeposited nickel mask for sputter etching is illustrated in FIGS. 2A and 2B. In essence, the gold layer 16 may be omitted and the nickel mask itself substituted for the gold or, in some cases, the platinum or palladium layer may be utilized as the outer layer of the metallization pattern. Referring to FIG. 2A, the practice is similar to that previously described except that the photoresist pattern 20 is formed directly on the surface of the platinum or palladium layer 15. Generally, with these particular metals standard photoresist materials adhere satisfactorily and the thin nickel film is unnecessary. The thicker nickel mask pattern 21 then is formed as described above by an electrodeposition process.

As shown in FIG. 2B, following removal of the photoresist pattern sputter etching procedure is again followed to define the precise metallization pattern.

Generally, in either of the embodiments described above the thick nickel mask layer has a thickness of from 6000 to 8000 A. The photoresist layer should exceed this thickness in order to prevent overplating and thus poor definition of the pattern. In some cases, as is well known in the art, thicker photoresist films are produced by multiple coatings which have the additional advantage of reducing pinhole density and improving definition.

It will be apparent from the foregoing disclosure, which is in terms of embodiments utilizing particular metals, that a variety of other metallization combinations may likewise be defined by nickel masked sputter etching if the metals in question have suitable sputter etching rates. For example, two metal systems such as tungsten and titanium have been proposed and even single metal layers may be used for particular types of devices. The advantageous features of the invention reside in the high degree of definition and masking properties of an electrodeposited nickel film. In general, for the first or titanium metal layer the following metals may be substituted: zirconium, hafnium, vanadium, tantalum, niobium and chromium. For the second metal layer, in addition to platinum or palladium, nickel, rhodium, tungsten, tantalum, molybdenum and silver may be substituted.

What is claimed is:

1. In the fabrication of a semiconductor device comprising a semiconductor body having a metallization pattern on a surface thereof, the method of defining the metallization pattern including the steps of depositing on the entire said surface a metal layer, said metal layer having a surface portion comprising a layer of gold having a thickness of at least about 20,000 angstroms, forming on the surface of said metal layer a mask comprising a layer of photoresist defining said metallization pattern, electrodepositing a layer of nickel in said mask said nickel having a thickness of from about 5,000 angstroms to 8,000 angstroms, removing said photoresist layer, and subjecting said nickel masked surface to cathodic etching for a period sufficient to remove at least part of the thickness of the unmasked portions of said metal layer said part including all of said unmasked gold layer.

2. The method in accordance with claim 1 in which said layer of photoresist has a thickness of about 10,000 angstroms and is thereby thicker than said layer of nickel.

3. The method in accordance with claim 1 in which said metal layer includes a film of titanium at the base of the metal layer next to the surface of the semiconductor body, characterized in that said cathodic etching treatment is carried out in an ambient containing oxygen, whereby the process of removing the metal layer terminates when the titanium layer is exposed.

4. The method in accordance with claim 1 which includes the step of removing the nickel layer comprising said mask.

References Cited

UNITED STATES PATENTS

| | | | |
|---|---|---|---|
| 3,556,951 | 1/1971 | Cerniglia et al. | 204—15 |
| 3,388,048 | 6/1968 | Szabo | 204—15 |
| 3,607,679 | 9/1971 | Melroy et al. | 204—15 |
| 2,995,475 | 8/1961 | Sharplers | 204—32 S |
| 3,623,961 | 11/1971 | Van Laer | 204—15 |
| 3,271,286 | 9/1966 | Lepselter | 204—192 |

FREDERICK C. EDMUNDSEN, Primary Examiner

U.S. Cl. X.R.

204—15